(12) United States Patent
Jang et al.

(10) Patent No.: US 7,583,547 B2
(45) Date of Patent: Sep. 1, 2009

(54) OVER-DRIVING CIRCUIT IN SEMICONDUCTOR MEMORY DEVICE

(75) Inventors: Chae-Kyu Jang, Kyoungki-do (KR); Ju-Young Seo, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 419 days.

(21) Appl. No.: 11/529,275

(22) Filed: Sep. 29, 2006

(65) Prior Publication Data
US 2007/0070726 A1 Mar. 29, 2007

(30) Foreign Application Priority Data
Sep. 29, 2005 (KR) ............... 10-2005-0091661
May 17, 2006 (KR) ............... 10-2006-0044163

(51) Int. Cl.
*G11C 7/02* (2006.01)
(52) U.S. Cl. ............ 365/205; 365/189.11; 365/207
(58) Field of Classification Search ............ 365/189.11, 365/205, 207
See application file for complete search history.

(56) References Cited

U.S. PATENT DOCUMENTS

| 6,717,880 | B2* | 4/2004 | Jeong ............ 365/189.07 |
| 6,950,339 | B2* | 9/2005 | Jeong et al. ............ 365/185.17 |
| 2007/0070757 | A1* | 3/2007 | Jang ............ 365/208 |

FOREIGN PATENT DOCUMENTS

KR 10-2005-0009012 1/2005

OTHER PUBLICATIONS

Korean Office Action issued in corresponding Korean Patent Application No. KR 10-2006-0044163, dated on Dec. 31, 2007.

* cited by examiner

*Primary Examiner*—Tuan T Nguyen
*Assistant Examiner*—Hien N Nguyen
(74) *Attorney, Agent, or Firm*—Mannava & Kang, P.C.

(57) ABSTRACT

A semiconductor memory over-driving scheme for a semiconductor memory device makes it possible to secure a high-speed sensing operation of a memory sense amplifier, regardless of a change of a power supply voltage. Over-driving efficiency is improved by controlling the discharging time and the drivability using different sized the drivers when the power supply voltage fluctuates while the bit line over-driving operation is performed.

20 Claims, 3 Drawing Sheets

OVER-DRIVING CIRCUIT IN SEMICONDUCTOR MEMORY DEVICE

FIELD OF INVENTION

The present invention relates to a semiconductor memory device; and, more particularly, to an over-driving circuit to make it possible to secure a high-speed sensing operation of a memory sense amplifier regardless of change of power supply voltage.

BACKGROUND

Generally, in order to reduce power consumption of a semiconductor memory device and maintain the reliability of the device, a power supply voltage used in the memory device has been continuously decreased. Accordingly, while the power consumption is gradually reduced, a range of current and voltage which should be sensed by circuitries and elements in the semiconductor memory device are more and more reduced. That is, the sensing margin of current and voltage has been gradually decreased. Therefore, it is necessary to provide more precise circuitries and elements for more minute sensing operations and, accordingly, a sensing circuitry is significantly needed in an integration circuit in order to sufficiently sense and amplify the signal.

In conventional semiconductor memory devices, there is a bit line sense amplifier (BLSA) used as sensing circuitry to sense and amplify data when the data are read out and stored in a memory cell device.

With the increment of integration of the semiconductor memory devices, higher performance of the bit line sense amplifier (BLSA) is required. However, the more the load applied to a pull-up device and a pull-down device in the bit line sense amplifier (BLSA) increases, the more time is needed to amplify the sensed data up to the power supply voltage. Sometimes, it is impossible to amplify the sensed data up to a desired voltage level. Therefore, in order to supplement this disadvantage, an over-driving circuit is employed in such a manner that an external voltage (VEXT=power supply voltage (VDD)) is used together with a core voltage VCORE, driving a pull-up line (RTO: Restore) of the bit line sense amplifier. That is, in order to improve the amplification speed of data in the sense amplifier, the pull-up line RTO is increased to the external voltage (VEXT=power supply voltage (VDD)) which is higher than the core voltage VCORE and thereafter the core voltage VCORE is applied to the pull-up line RTO.

FIG. 1 is a block diagram of a conventional bit line sensing circuit including an over-driving circuit.

Referring to FIG. 1, a conventional over-driving circuit is composed of a core voltage supplier 10 to drive a pull-up line RTO of a bit line sense amplifier 40 to a core voltage VCORE, a power voltage supplier 20 to drive the pull-up line RTO of the bit line sense amplifier 40 to an external voltage (VEXT=power supply voltage (VDD)), and a discharge unit 30 to discharge the driven voltage on the pull-up line RTO of the bit line sense amplifier 40.

However, in the conventional over-driving circuit, the over-driving operation is carried out at the same over-driving timing and the same voltage (VEXT=power supply voltage (VDD)) even though the external voltage (VEXT=power supply voltage (VDD)) to be used for the over-driving of the bit line sense amplifier is altered into a high voltage level (high_VDD) or a low voltage level (low_VDD) as compared with a predetermined potential level set to an external voltage. The power supply voltage is used as a power source to operate DRAM operation, wherein the potential levels of the power supply voltage are 3.3V, 2.5V, 1.8V, and 2.5V in SDR SDRAMs, DDR SDRAMs and mobile memories for low power, DDR2 SDRAMs, and Rambus SDRAMs, respectively.

If the high potential level (high_VDD) is applied to the pull-up line RTO of the bit line sense amplifier 40 due to the fluctuation in the exterior voltage (VEXT=power supply voltage (VDD)), a side effect of increased capacitance stress of the memory cell causes generation of core voltage noise (VCORE Noise). Dissipation of current is generated due to the unnecessary and high potential level.

Likewise, when the low potential level (low_VDD) is applied to the pull-up line RTO of the bit line sense amplifier 40, a delay in time to amplify the data stored in the memory cell up to the desired voltage level occurs because the potential level of the over-driving is not sufficient. Efficiency of the over-driving operation is then degraded.

SUMMARY OF THE INVENTION

It is, therefore, an object of the present invention to provide an over-driving circuit capable of preventing power consumption caused by fluctuation of a power supply voltage and to improve the over-driving efficiency.

In accordance with an aspect of the present invention, there is provided a semiconductor memory device comprising: a bit line sense amplifier; a voltage fluctuation detecting block for outputting a first signal and a second signal in response to a fluctuation generated when a potential level of a power supply voltage is different from a predetermined potential level; a pull-up line driving block for applying the power supply voltage to a pull-up line of the bit line sense amplifier through a first path in response to the first signal; and a voltage regulating block for controlling, in response to the second signal, a potential level of a driving voltage applied to the pull-up, by controlling a drivability of a driver to additionally apply the power supply voltage to the pull-up line and controlling a discharging time required to discharge the driving voltage applied to the pull-up.

In accordance with another aspect of the present invention, there is provided a semiconductor memory device comprising: a bit line sense amplifier; a voltage fluctuation detecting block for detecting a fluctuation signal generated when a potential level of a power supply voltage is different from a predetermined potential level; a plurality of drivers which are different from each other in sizes, being turned on individually for driving a pull-up line of the bit line sense amplifier; and a voltage regulating block for controlling a driving voltage on the pull-up line by controlling the plurality of drivers individually in response to the fluctuation signal from the voltage fluctuation detecting block and by controlling a discharging time to discharge the driving voltage.

In accordance with further another aspect of the present invention, there is provided a semiconductor device, including a voltage detecting block for detecting a fluctuation of a power voltage inputted from an external block, a voltage driving block for supplying a driving voltage into an internal block based on a detection result of the voltage detecting block and a voltage regulating block for controlling a potential level of the driving voltage supplied to the internal block by using an additional voltage and controlling a discharging time required to discharge the driving voltage.

In the present invention, if a power supply voltage fluctuates while an over-driving operation of a bit line is performed, the efficiency of the drivability is not reduced due to detection of this alternation and controlling a size of driver and a discharging time on the bit line. While the over-driving operation is performed, a pull-up line of a bit line sense amplifier is charged by a size-variable driver in response to the alternation of the power supply voltage. Discharge time of the pull-up line of the bit line sense amplifier is controlled.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

Embodiments of the present invention will be described with reference to the accompanying drawings. Since these embodiments are provided so that a person of ordinary skill in the art will be able to understand the present invention, they may be modified in various manners and the scope of the present invention is not limited by the embodiments described herein.

Figure 1:
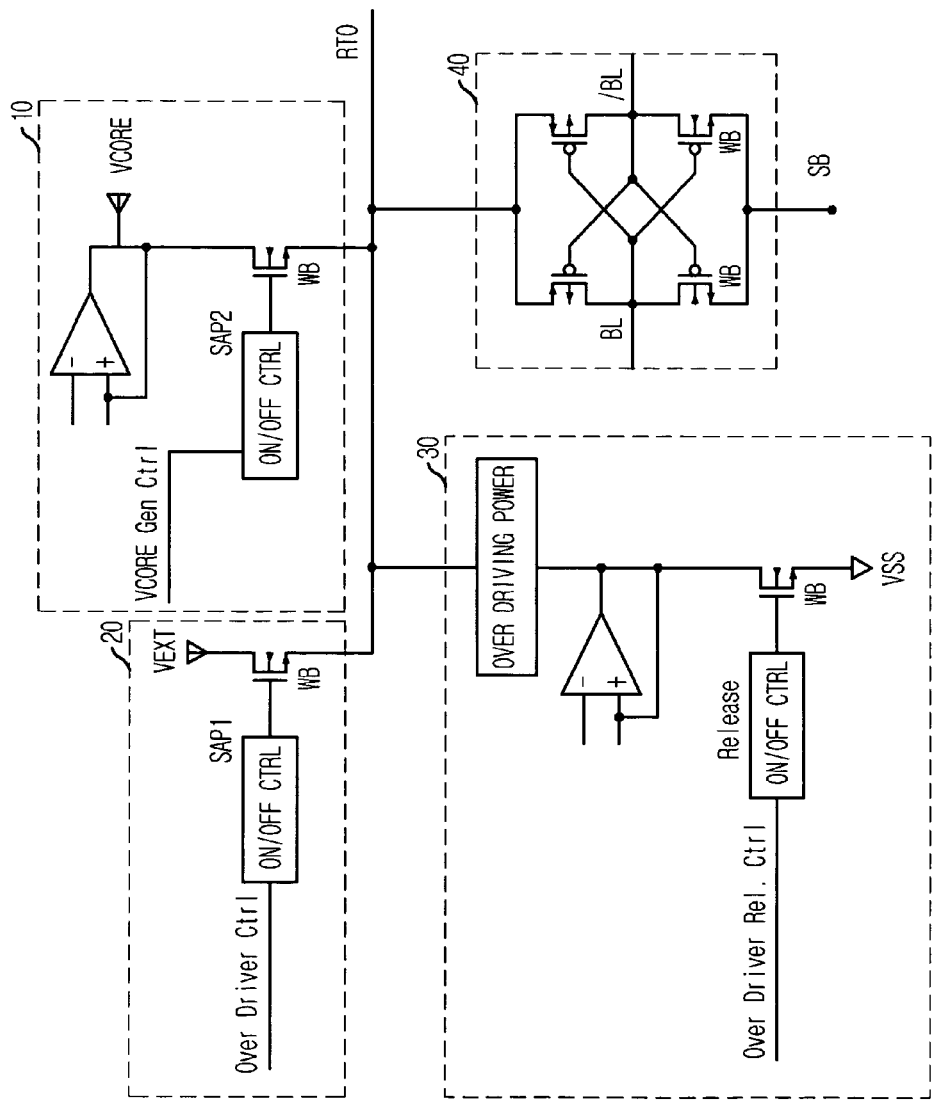
FIG. 1 is a block diagram of a conventional bit line sensing circuit including an over-driving circuit.
Figure 2:
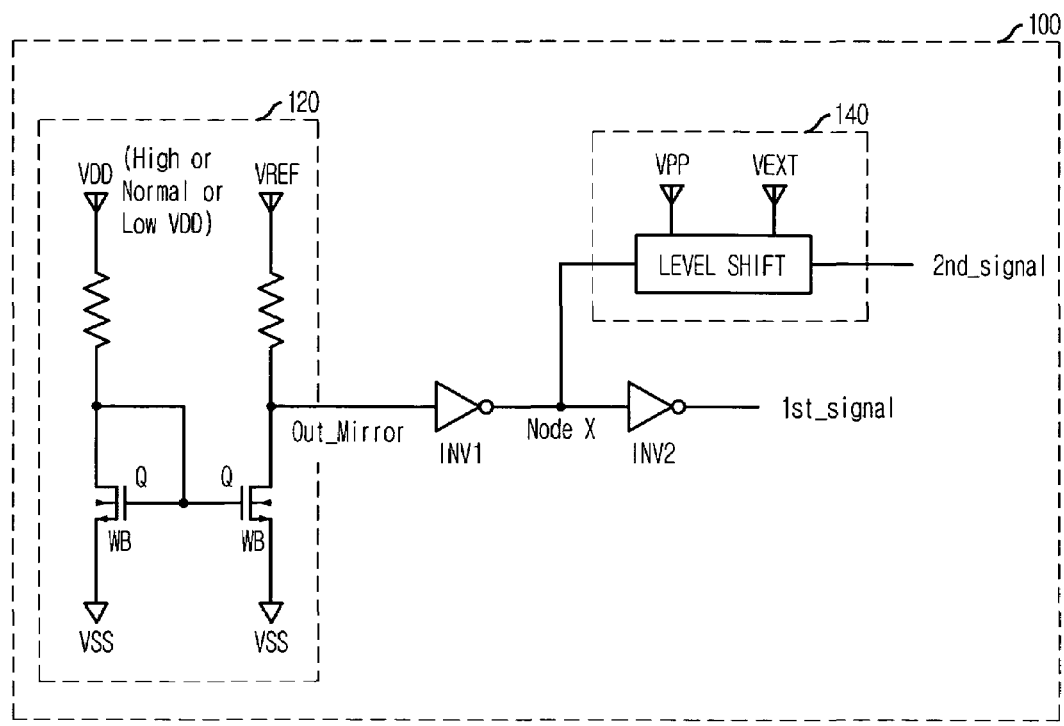
FIG. 2 is a circuit diagram of an apparatus for sensing fluctuation of power supply voltage in accordance with the present invention.

FIG. 2 is a circuit diagram of an apparatus for sensing a fluctuation of a power supply voltage VDD in accordance with the present invention.

Referring FIG. 2, a fluctuation sensing apparatus 100 includes a current mirror circuit 120, a first inverter INV1, a second inverter INV2 and a level shifter 140. The current mirror circuit 120 is connected to a power supply voltage (normal VDD) which can be changed in accordance with a fluctuation of PVT (Process Voltage Temperature). That is, the potential level (Normal VDD) to be set for the power supply voltage can be altered into a high voltage level (high_VDD) or a low voltage level (low_VDD). Further, the current mirror circuit 120 is connected to a reference voltage VREF which does not fluctuate. Therefore, the current mirror circuit 120 outputs an output voltage Out_Mirror, as a differential signal, according to the power supply voltage (normal_VDD) and the reference voltage VREF. As set forth above, the power supply voltage is typically used as a power source for DRAM operation, wherein the potential levels of the power supply voltage are 3.3V, 2.5V, 1.8V, and 2.5V in SDR SDRAMs, DDR SDRAMs and mobile memories for low power, DDR2 SDRAMs, and Rambus SDRAMs, respectively. The first inverter INV1 receives the output voltage Out_Mirror from the current mirror circuit 120 and outputs to node X an inverted signal which is produced by the phase shift of the received signal. The second inverter INV2 receives an output voltage from the first inverter INV1 and outputs an inverted signal, as a first signal, which is produced by the phase shift of the received signal. In response to a logic level of the signal which is applied to node X, the level shifter 140 outputs a fluctuation voltage (high voltage VPP or power supply voltage VDD), as a second signal, when a potential level fluctuates, and outputs the power supply voltage VDD, as the second signal, when the potential level does not fluctuate.

A logic level which is driven at node X, when the potential level of the power supply voltage VDD fluctuates at the current mirror circuit 120, is out of phase with a logic level produced when the potential level of the power supply voltage VDD does not fluctuate at the current mirror circuit 120.

When the potential level of the power supply voltage VDD fluctuates by the PVT fluctuation and the fluctuated power supply voltage (Low_VDD) is lower than the predetermined potential level (Normal_VDD), the power supply voltage VDD in the level shifter 140 is reduced and the level shifter 140 then outputs a fluctuated voltage in a high level VPP as the second signal. When the potential level of the power supply voltage VDD fluctuates by the PVT fluctuation and the fluctuated power supply voltage (High VDD) is higher than the predetermined potential level (Normal_VDD), the power supply voltage VDD in the level shifter 140 is increased and the level shifter 140 then outputs a fluctuated voltage in a power supply vulgate VDD as the second signal.

In the embodiment of the present invention, the apparatus 100 for sensing the power supply voltage VDD detects whether the potential level of the power supply voltage VDD is altered into a low level (Low_VDD) and whether the potential level of the power supply voltage VDD is not fluctuated. However, it is possible to detect whether the potential level of the power supply voltage VDD is altered into a high level (High_VDD) according to the architecture configured by a designer.

Figure 3:
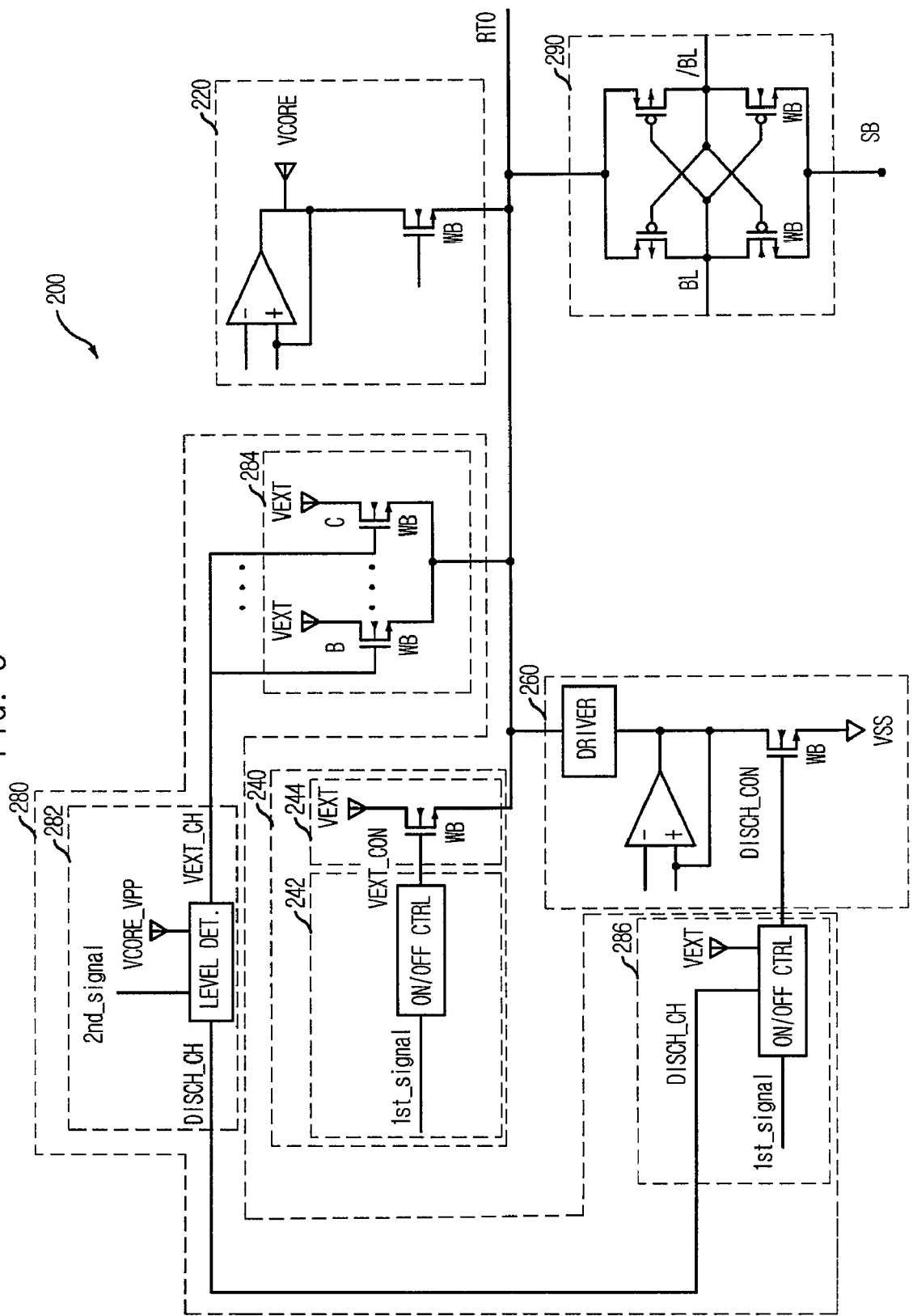
FIG. 3 is a circuit diagram of a bit line sensing circuit including the over-driving circuit illustrated in FIG. 2.

FIG. 3 is a circuit diagram showing a bit line sensing circuit 200 including the over-driving circuit illustrated in FIG. 2.

Referring FIG. 3, the bit line sensing circuit 200 according to the present invention includes a bit line sensing amplifier 290, a pull-up line driver 240 and a voltage regulator 280. The pull-up line driver 240 drives a pull-up line of the bit line sensing amplifier 290 in response to the first signal from the fluctuation detecting apparatus 100 illustrated in FIG. 2. In the pull-up line driver 240, an external power supply voltage (VEXT=VDD) is applied to the pull-up line of the bit line sensing amplifier 290 when a first path is formed in response to the first signal. The voltage regulator 280 controls the potential level of the voltage driven on the pull-up line RTO of the bit line sensing amplifier 290 by controlling drivability on the pull-up line RTO of the bit line sensing amplifier 290 through a second path, in response to the second signal from the power voltage fluctuation detecting apparatus illustrated in FIG. 2, and by controlling a discharging time to discharge the driving voltage on the of the pull-up line RTO.

The bit line sensing circuit 200 further includes a core voltage supply 220 to drive a core voltage on the pull-up line RTO of the bit line sensing amplifier 290 and a discharger 260 to discharge the driving voltage on the of the pull-up line RTO of the bit line sensing amplifier 290.

The pull-up line driver 240 in the bit line sensing circuit 200 having the over-driving circuit includes: an on-off controller 242 which controls the power supply voltage (VEXT=VDD) to be driven on the pull-up line RTO of the bit line sensing amplifier 290 via the first path by outputting a logic level of a power supply control signal VEXT_CON in response to the first signal; and a first charger 244 to apply, in response to the power supply control signal VEXT_CON, the power supply voltage (VEXT=VDD) to the pull-up line RTO of the bit line sensing amplifier 290 through the first path.

The first charger 244 includes an NMOS transistor which applies the power supply voltage (VEXT=VDD) to the pull-up line RTO of the bit line sensing amplifier 290 through a source-drain path and the first path in response to the power supply control signal VEXT_CON received by a gate electrode.

The voltage regulator 280 in the bit line sensing circuit 200 includes a level detector 282, a second charger 284 and a discharging time controller 286. The level detector 282 determines a potential level of a charging voltage signal VEXT_CH and a discharging signal DISCH_CH which are outputted in response to the second signal. By controlling the drivability through a plurality of charging paths in response to the charging voltage signal VEXT_CH, the second charger 284 controls a potential level of an output voltage when the power supply voltage (VEXT=VDD) is applied to the pull-up line RTO of the bit line sensing amplifier 290. The discharging time controller 286 controls the discharging time to discharge the voltage, which is applied on the pull-up line RTO of the bit line sensing amplifier 290, by outputting a discharging control signal DISCH_CON in response to the first signal and the discharging signal DISCH_CH.

The second charger 284 includes a plurality of NMOS transistors which apply the power supply voltage (VEXT=VDD) to the pull-up line RTO of the bit line sensing amplifier 290 through a source-drain path and the second path in response to the charging voltage signal VEXT_CH received by gate electrodes which are arranged in parallel with each other.

As mentioned above, the second charger 284 includes the plurality of NMOS transistors. Each of these transistors has a different size. When the charging voltage signal VEXT_CH is applied to the gate electrodes, the number of the transistors which are turned on is variable. The drivability on the pull-up line RTO of the bit line sensing amplifier 290 is controlled by the variation in numbers of the turn-on transistors.

Also, the discharging time controller 286 controls the discharging operation of the voltage, which is driven on the pull-up line RTO of the bit line sensing amplifier 290, by controlling the logic level of the discharging control signal DISCH_CON in response to the first signal.

Simultaneously, the discharging time of the voltage which is driven on the pull-up line RTO of the bit line sensing amplifier 290 is adjusted by controlling, in response to the potential level of the discharging signal DISCH_CH, the activation time the discharging control signal DISCH_CON is high in a logic level.

The operation of the bit line sensing circuit 200 including the over-driving circuit will be described below in detail.

When the fluctuation sensing apparatus 100 detects a low level fluctuation in which the power supply voltage (VEXT=VDD) is altered into a low level, the second signal is set up to a high voltage VPP and the high voltage VPP is input into the level detector 282. At this time, the level detector 282 changes the potential level of the outputted charging voltage signal VEXT_CH. Each of the NMOS transistors in the second charger 284 is turned on individually in response to the potential level of the changed charging voltage signal VEXT_CH. The drivability on the pull-up line RTO of the bit line sensing amplifier 290 is controlled by the number of turn-on transistors. As a result, the power supply voltage (VEXT=VDD), which is produced in proportion to the number of the turn-on transistors, is driven on the pull-up line RTO of the bit line sensing amplifier 290 together with the power supply voltage (VEXT=VDD) driven by the first charger 242. Furthermore, even if the power supply voltage (VEXT=VDD) has a fluctuation to a low level (Low_VDD), a sufficient potential level is provided for the pull-up line RTO of the bit line sensing amplifier 290 by changing the potential level of the discharging signal DISCH_CH and controlling the discharging time to discharge the applied voltage on the pull-up line RTO of the bit line sensing amplifier 290 through the level detector 282.

Contrary to the above-mentioned operation, if the power supply voltage (VEXT=VDD) which is altered into a high level is detected by the fluctuation sensing apparatus 100, the second signal is in a potential level of the core voltage VCORE and the second signal is input into the level detector 282. The level detector 282 performs non-activation of the charging voltage signal VEXT_CH and the non-activated charging voltage signal VEXT_CH turns off the plurality of NMOS transistors in the second charger 284. That is, the power supply voltage (VEXT=VDD) from the first charger 242 is driven on the pull-up line RTO of the bit line sensing amplifier 290. Also, the power supply voltage (VEXT=VDD) is altered into a high level (High_VDD) without current consumption, by changing the potential level of the discharging signal DISCH_CH in the level detector 282 and controlling the discharging time to discharge the applied voltage on the pull-up line RTO of the bit line sensing amplifier 290 through the discharger 260.

When there is no fluctuation of the power supply voltage (VEXT=VDD) in the fluctuation sensing apparatus 100 in FIG. 2, the potential level of the first signal is the same as that of the conventional over-driving control signal, and the on-off control and discharging operations are also the same as the conventional over-driving control operation.

In the present invention, the potential level of the power supply voltage (VEXT=VDD) on the pull-up line RTO of the bit line sensing amplifier 290 is controlled, in the case where the power supply voltage (VEXT=VDD) is changed while the bit line over-driving operation is performed. Even if the power supply voltage (VEXT=VDD) fluctuates, the efficiency of the drivability on the pull-up line RTO of the bit line sense amplifier 290 is not reduced by preventing a fluctuation of the voltage level substantially applied to the pull-up line RTO.

As apparent from the above, the present invention prevents the over-driving efficiency from being reduced by controlling the discharging time and the drivability using the size of the drivers when the power supply voltage is fluctuated while the bit line over-driving operation is performed.

The present application contains subject matter related to the Korean patent applications Nos. KR 10-2005-0091661 and KR 10-2006-0044163, filed in the Korean Patent Office on Sep. 29, 2005 and on May 17, 2006 respectively, the entire contents of which being incorporated herein by references.

While the present invention has been described with respect to certain specific embodiments, it will be apparent to those skilled in the art that various changes and modifications may be made without departing from the spirit and scope of the invention as defined in the following claims.

What is claimed is:

1. A semiconductor memory device, comprising:
   a bit line sense amplifier;
   a voltage fluctuation detecting block for outputting a first signal and a second signal in response to a fluctuation generated when a potential level of a power supply voltage is different from a predetermined potential level;
   a pull-up line driving block for applying the power supply voltage to a pull-up line of the bit line sense amplifier through a first path in response to the first signal; and
   a voltage regulating block for controlling, in response to the second signal, a potential level of a driving voltage applied to the pull-up line, by controlling a drivability of a driver to additionally apply the power supply voltage to the pull-up line and controlling a discharging time required to discharge the driving voltage applied to the pull-up line.

2. The semiconductor memory device as recited in claim 1, further comprising:
   a core voltage supply circuit for applying a core voltage to the pull-up line; and a discharging circuit for discharging the driving voltage applied to the pull-up line.

3. The semiconductor memory device as recited in claim 1, wherein the pull-up line driving circuit includes:
an on/off controller for producing a power supply control signal in response to the first signal; and
a first charging circuit for applying the power supply voltage to the pull-up line in response to the power supply control signal.

4. The semiconductor memory device as recited in claim 3, wherein the first charging circuit includes an NMOS transistor having a gate to which the power supply control signal is applied, wherein the NMOS transistor applies the power supply voltage to the pull-up line through the first path.

5. The semiconductor memory device as recited in claim 2, wherein the voltage regulating circuit includes:
a level detector for determining a potential level of a charging voltage and a discharging signal in response to the second signal;
a second charging circuit for additionally applying the power supply voltage to the pull-up line through the second path based on the potential level determined in the level detector; and
a discharging control circuit for discharging the driven voltage on the pull-up line by outputting a discharging control signal in response to the first signal and the discharging signal.

6. The semiconductor memory device as recited in claim 5, wherein the second charging circuit includes a plurality of NMOS transistors, each of which has a gate to which the power supply control signal is applied, wherein the NMOS transistor applies the power supply voltage to the pull-up line through the second path.

7. The semiconductor memory device as recited in claim 6, wherein the second charging circuit controls a number of the NMOS transistors which are turned on by the power supply control signal and wherein the NMOS transistors are different from each other in size.

8. The semiconductor memory device as recited in claim 5, wherein the discharging control circuit produces a discharging control signal in response to the first signal and the discharging signal.

9. The semiconductor memory device as recited in claim 5, wherein the discharging control circuit produces a discharging control signal and controls an activation time of the discharging control signal in a logic high level.

10. The semiconductor memory device as recited in claim 1, wherein the voltage fluctuation detecting block includes:
a current-mirror circuit to receive the power supply voltage which is be changed by a PVT fluctuation and a reference voltage (VREF) which is not changed by the PVT fluctuation and for outputting a fluctuation signal as an output signal;
a first inverter to receive the output signal from the current mirror circuit and output an inverted signal to a node;
a second inverter connected to the node, outputting the first signal by inverting the inverted signal; and
a level shifter to output a fluctuation voltage as the second signal when a potential level of the power supply voltage is changed or to output the power supply voltage as the second signal when the potential level is not changed.

11. The semiconductor memory device as recited in claim 10, wherein the fluctuation signal of the current-mirror circuit produced when the potential level of the power supply voltage is changed is out of phase with that of the current-mirror circuit produced when the potential level of the power supply voltage is not changed.

12. The semiconductor memory device as recited in claim 10, wherein the level shifter outputs a high voltage as the second signal when the potential level of the power supply voltage is changed by the PVT fluctuation and the changed power supply voltage is lower than a predetermined potential level.

13. The semiconductor memory device as recited in claim 10, wherein the level shifter outputs a core voltage as the second signal when the potential level of the power supply voltage is changed by the PVT fluctuation and the changed power supply voltage is higher than a predetermined potential level.

14. A semiconductor device, comprising:
a voltage fluctuation detecting block for detecting a fluctuation signal generated when a potential level of a power supply voltage is different from a predetermined potential level;
a plurality of drivers which are different from each other in size, being turned on individually for driving a pull-up line of a bit line sense amplifier; and
a voltage regulating block for controlling a driving voltage on the pull-up line by controlling the plurality of drivers individually in response to the fluctuation signal from the voltage fluctuation detecting block and by controlling a discharging time to discharge the driving voltage.

15. A semiconductor device, comprising:
a voltage detecting block for detecting a fluctuation of a power voltage inputted from an external block;
a voltage driving block for supplying a driving voltage into an internal block based on a detection result of the voltage detecting block; and
a voltage regulating block for controlling a potential level of the driving voltage supplied to the internal block by using an additional voltage and controlling a discharging time required to discharge the driving voltage.

16. The semiconductor device as recited in claim 15, wherein the voltage detecting block outputs a first signal and a second signal in response to the fluctuation generated when a potential level of the power voltage is different from a predetermined potential level.

17. The semiconductor device as recited in claim 16, wherein the voltage driving block supplies the power supply voltage to the internal block in response to the first signal.

18. The semiconductor device as recited in claim 17, wherein the voltage regulating block controls a potential level of the driving voltage in response to the second signal.

19. The semiconductor device as recited in claim 18, further comprising:
a core voltage supply circuit for supplying a core voltage to the internal block; and
a discharging circuit for discharging the driving voltage applied to the internal block.

20. The semiconductor device as recited in claim 18, wherein the voltage detecting block includes:
a current-mirror circuit to receive the power voltage which is be changed by a PVT fluctuation and a reference voltage (VREF) which is not changed by the PVT fluctuation and for outputting a fluctuation signal as an output signal;
a first inverter to receive the output signal from the current mirror circuit and output an inverted signal to a node;
a second inverter connected to the node, outputting the first signal by inverting the inverted signal; and
a level shifter to output a fluctuation voltage as the second signal when a potential level of the power supply voltage is changed or to output the power supply voltage as the second signal when the potential level is not changed.

* * * * *